(12) United States Patent
Hopper et al.

(10) Patent No.: US 6,844,585 B1
(45) Date of Patent: Jan. 18, 2005

(54) CIRCUIT AND METHOD OF FORMING THE CIRCUIT HAVING SUBSURFACE CONDUCTORS

(75) Inventors: Peter J. Hopper, San Jose, CA (US); Vladislav Vashchenko, Palo Alto, CA (US); Philipp Lindorfer, San Jose, CA (US); Andy Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/173,911

(22) Filed: Jun. 17, 2002

(51) Int. Cl.[7] .......................................... H01L 29/788
(52) U.S. Cl. .................... 257/315; 257/316; 257/317
(58) Field of Search ........................ 257/315, 316, 257/317, 322, 345, 611, 263, 408, 394, 344, 336

(56) References Cited

U.S. PATENT DOCUMENTS

| | | | |
|---|---|---|---|
| 5,512,770 A | * 4/1996 | Hong | 257/345 |
| 5,932,873 A | 8/1999 | Bergemont et al. | 250/208.1 |
| 5,962,844 A | 10/1999 | Merrill et al. | 250/214 A |
| 5,965,875 A | 10/1999 | Merrill | 250/226 |
| 5,970,316 A | 10/1999 | Merrill | 438/57 |
| 5,982,012 A | 11/1999 | Merrill | 257/463 |
| 6,002,432 A | 12/1999 | Merrill et al. | 348/241 |
| 6,018,365 A | 1/2000 | Merrill | 348/302 |
| 6,066,510 A | 5/2000 | Merrill | 438/57 |
| 6,088,058 A | 7/2000 | Mead et al. | 348/296 |
| 6,107,173 A | * 8/2000 | Han | 257/E21.623 |
| 6,117,742 A | * 9/2000 | Gardner et al. | 257/E21.205 |
| 6,150,683 A | 11/2000 | Merrill et al. | 257/292 |
| 6,160,282 A | 12/2000 | Merrill | 257/292 |
| 6,211,510 B1 | 4/2001 | Merrill et al. | 250/208.1 |
| 6,246,043 B1 | 6/2001 | Merrill | 250/208.1 |
| 6,355,528 B1 | * 3/2002 | Ishida et al. | 257/E21.435 |
| 6,369,420 B1 | * 4/2002 | Yeh et al. | 257/E21.68 |
| 6,369,853 B1 | 4/2002 | Merrill et al. | 348/302 |
| 6,403,426 B1 | * 6/2002 | Montree et al. | 257/E21.435 |
| 6,410,899 B1 | 6/2002 | Merrill et al. | 250/208.1 |
| 6,436,773 B1 | * 8/2002 | Yu | 438/284 |
| 6,444,523 B1 | * 9/2002 | Fan et al. | 257/E21.682 |
| 6,452,633 B1 | 9/2002 | Merrill et al. | 348/302 |
| 6,476,372 B2 | 11/2002 | Merrill et al. | 250/208.1 |
| 6,476,454 B2 | * 11/2002 | Suguro | 257/410 |
| 6,489,206 B2 | * 12/2002 | Chen et al. | 438/300 |
| 6,512,544 B1 | 1/2003 | Merrill et al. | 348/302 |
| 6,525,304 B1 | 2/2003 | Merrill et al. | 250/208.1 |
| 6,606,120 B1 | 8/2003 | Merrill et al. | 348/273 |
| 6,632,701 B2 | 10/2003 | Merrill | 438/70 |
| 6,636,261 B1 | 10/2003 | Pritchard et al. | 348/308 |
| 6,697,114 B1 | 2/2004 | Merrill | 348/308 |
| RE38,499 E | 4/2004 | Merrill et al. | 348/301 |
| 6,727,521 B2 | 4/2004 | Merrill | 257/98 |
| 6,731,397 B1 | 5/2004 | Merrill et al. | 358/1.16 |
| 6,741,283 B1 | 5/2004 | Merrill et al. | 348/308 |
| 6,750,489 B1 | 6/2004 | Merrill | 257/292 |
| 6,760,070 B1 | 7/2004 | Merrill et al. | 348/294 |

* cited by examiner

*Primary Examiner*—John F. Niebling
*Assistant Examiner*—Walter L. Lindsay, Jr.
(74) *Attorney, Agent, or Firm*—Mark C. Pickering

(57) ABSTRACT

A MOS transistor and subsurface collectors can be formed by using a hard mask and precisely varying the implant angle, rotation, dose, and energy. In this case, a particular atomic species can be placed volumetrically in a required location under the hard mask. The dopant can be implanted to form sub-silicon volumes of arbitrary shapes, such as pipes, volumes, hemispheres, and interconnects.

20 Claims, 15 Drawing Sheets

CIRCUIT AND METHOD OF FORMING THE CIRCUIT HAVING SUBSURFACE CONDUCTORS

BACKGROUND OF THE INVENTION

1. Field of the Invention

The present invention relates to semiconductor circuit fabrication and, more particularly, to a circuit and a method of forming the circuit that has a subsurface network of conductive paths within a silicon substrate.

2. Description of the Related Art

Integrated circuit fabrication involves creating various semiconductor devices such as transistors, capacitors, resistors, and diodes within a single monolithic semiconductor substrate. Traditionally, a number of photolithographic and ion implantation steps are required to form the semiconductor devices.

In addition, to complete the circuit, conductors are formed to electrically connect the isolated devices together. A number of additional photolithographic steps are required to form the conductors that are required to connect the devices together to implement the circuit.

A typical method of providing conductive paths between devices is to form conductive interconnects on top of the silicon substrate using patterned layers of metal (or metal silicide or polysilicon). Interconnects created in the metallization process can be formed in multiple layers, by alternating metal layers with intermetallic dielectric (IMD) layers.

The IMD layers serve to electrically isolate the metal layers. The IMD layers are patterned to allow formation of vertical conductors between metal layers and devices, through use of a system of contacts and vias, or plugs. A multilevel interconnect system as described, can be used to create multiple conductive paths in three dimensions; it also allows conductors to be arranged to pass over or under adjacent conductors while remaining isolated from each other.

The cost to produce a semiconductor circuit is in large part defined by the complexity and number of photolithographic and ion implantation steps that are required to fabricate the circuit. As a result, as the complexity and number of steps required to fabricate the circuit increase, the cost to fabricate the circuit increases as well.

Thus, there is a need for a method of forming interconnects and devices, such as transistors, that reduces the complexity and/or number of photolithographic and ion implantation steps that are required to fabricate the interconnects and transistors of a circuit.

SUMMARY OF THE INVENTION

The present invention provides a circuit and a method of forming the circuit that reduces the complexity and/or number of photolithographic ion implantation steps that are required to fabricate the circuit. In the present invention, a semiconductor circuit, which is formed in a semiconductor material of a first conductivity type, includes a network of subsurface conductive channels of an opposite second conductivity type that are formed in the semiconductor material.

The network includes a first subsurface channel, and a second subsurface channel. Both the first and second subsurface channels have lengths and lie in the same plane. The first subsurface channel has a U-shaped section that passes around without contacting the second subsurface channel.

In addition, the semiconductor circuit can include a number of MOS transistors, including first and second MOS transistors. The first MOS transistor can have, for example, a first drain region of the second conductivity type that is formed in the substrate a distance away from an end of the first subsurface channel.

The first MOS transistor can also have a first channel region that lies between the first drain region and the end of the first subsurface channel. Further, the first MOS transistor can have a layer of gate oxide that is formed over the channel region, and a first gate that is formed on the layer of gate oxide over the channel region.

The second MOS transistor can have, for example, a second drain region of the second conductivity type that is formed in the substrate a distance away from an end of the first portion of the second subsurface channel. The second MOS transistor can also have a second channel, region that lies between the second drain region and the end of the second subsurface channel. Further, the second MOS transistor can have the layer of gate oxide formed over the second channel region, and a second gate that is formed on the layer of gate oxide over the second channel region.

The present invention also includes a method of forming a semiconductor circuit that is formed in a semiconductor material of a first conductivity type. The method includes the step of forming a hard mask on the semiconductor material. The hard mask has a pattern with an elongated vertical opening, a first elongated horizontal opening on one side of the elongated vertical opening, and a second elongated horizontal opening on an opposite side of the elongated vertical opening. The vertical opening, and the first and second horizontal openings exposing regions of oxide-covered semiconductor material.

The method also includes the step of implanting the semiconductor material with a dopant of a second conductivity type to form a first channel, a first section of a second channel, and a second section of the second channel. The implant is performed at an angle that is approximately 90° as measured counterclockwise from a surface of the semiconductor material.

The method further includes the step of implanting the exposed regions of the semiconductor material with a dopant of the second conductivity type to form a first connector section that is connected to the first section of the second channel. The implant is performed at an angle that is greater than zero degrees and less than 90° measured counterclockwise from the surface of the semiconductor material.

In addition, the method includes the step of implanting the exposed regions of the semiconductor material with a dopant of the second conductivity type to form a second connector section that is connected to the first connector section and the second section of the second channel. The implant is performed at an angle that is greater than 90° and less than 1800 measured counterclockwise from the surface of the semiconductor material.

A better understanding of the features and advantages of the present invention will be obtained by reference to the following detailed description and accompanying drawings that set forth an illustrative embodiment in which the principles of the invention are utilized.

DETAILED DESCRIPTION

FIGS. 1A–1C and 5A–5C show a series of views that illustrate an example of a method of forming a number of linked subsurface conductive channels in accordance with the present invention. As described in greater detail below, by forming linked subsurface conductive channels, a first level of connectivity is obtained which can reduce the complexity of, or eliminate the need for, a polysilicon local interconnect or a metal layer.

Figure 1A:
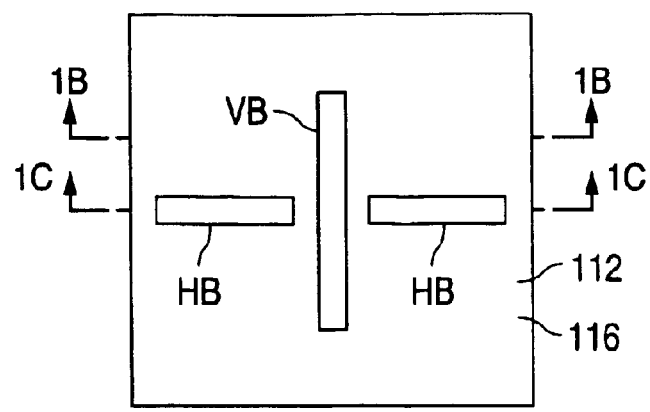
FIGS. 1A–1C through 5A–5C are a series of views illustrating an example of a method of forming a number of linked subsurface conductive channels in accordance with the present invention.
Figure 1B:
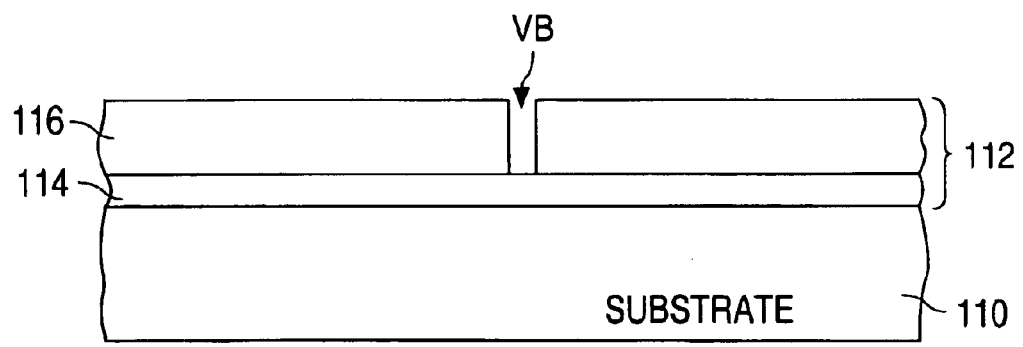
Figure 1C:
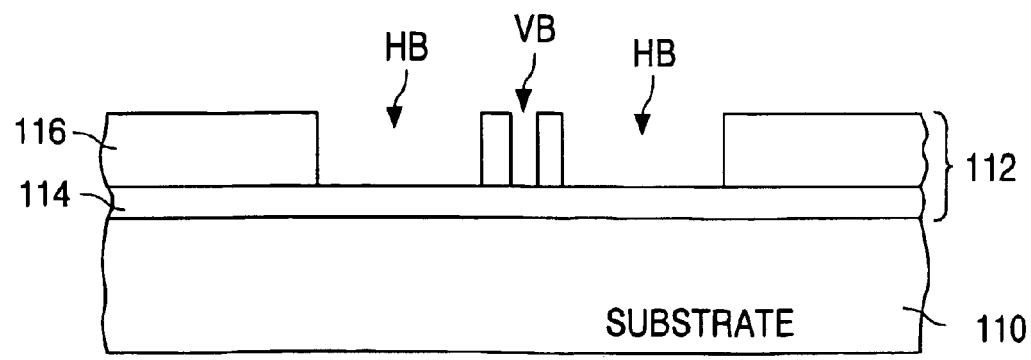

FIG. 1A shows a plan view that illustrates a portion of a wafer in accordance with the present invention. FIG. 1B shows a cross-sectional view taken along lines 1B—1B of FIG. 1A. FIG. 1C shows a cross-sectional view taken along lines 1C—1C of FIG. 1A. As shown in FIGS. 1A–1C, the method of the present invention, which utilizes a p-semiconductor substrate 110, begins by forming a patterned hard mask 112 on the top surface of substrate 110.

Hard mask 112 can be formed, for example, by forming a layer of oxide 114 on substrate 110, followed by the formation of a layer of nitride 116 on oxide layer 114. After this, a layer of masking material is formed on nitride layer 116, and then patterned. Next, the exposed regions of nitride layer 116 are etched to form a pair of horizontal openings HB and a vertical opening VB that expose the top surface of oxide layer 114. Following this, the masking material is removed.

Figure 2A:
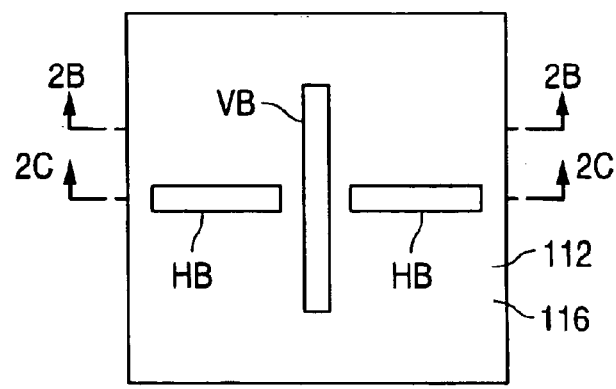
Figure 2B:
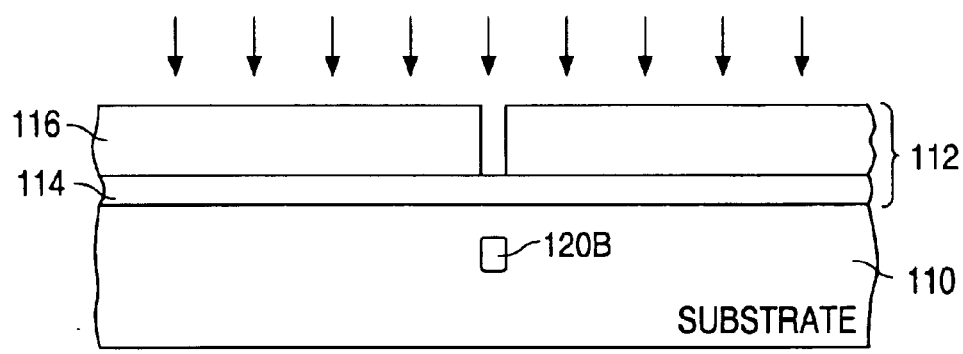
Figure 2C:
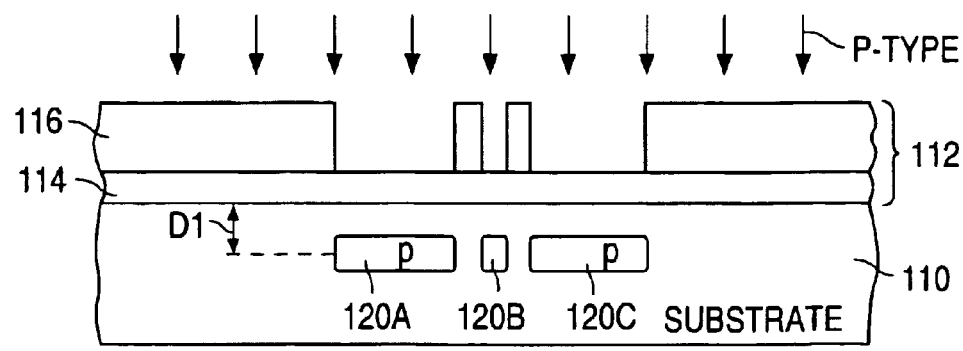

Next, as shown in FIGS. 2A–2C, a p-type material is optionally implanted into substrate 110 at an angle that is approximately 90° measured counterclockwise from the surface of substrate 110. The implant forms three isolation p-type regions 120A, 120B, and 120C in substrate 110. The implant energy used is sufficient to place the centers of isolation regions 120A–120C a distance D1 below the surface of substrate 110.

Figure 3A:
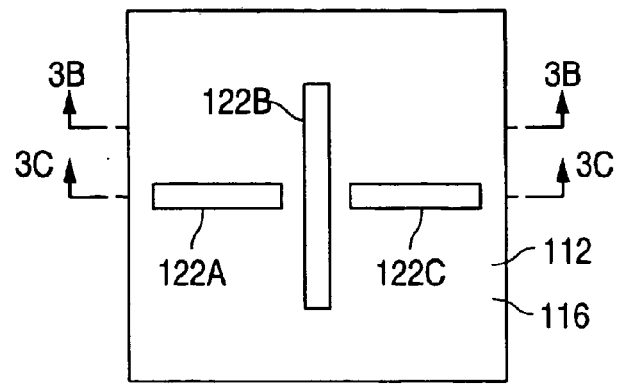
Figure 3B:
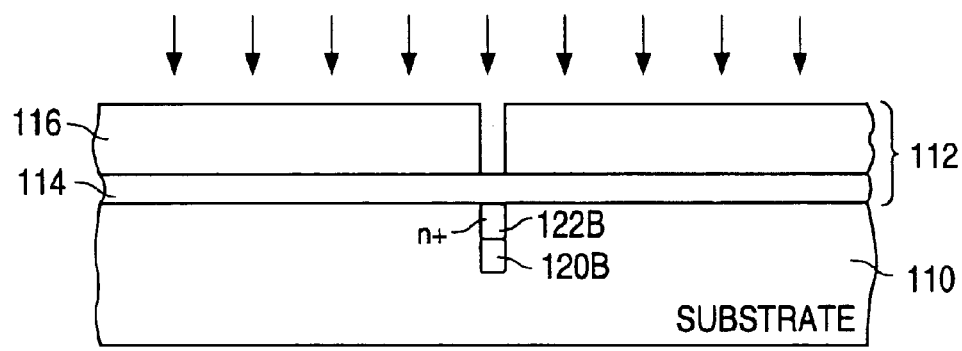
Figure 3C:
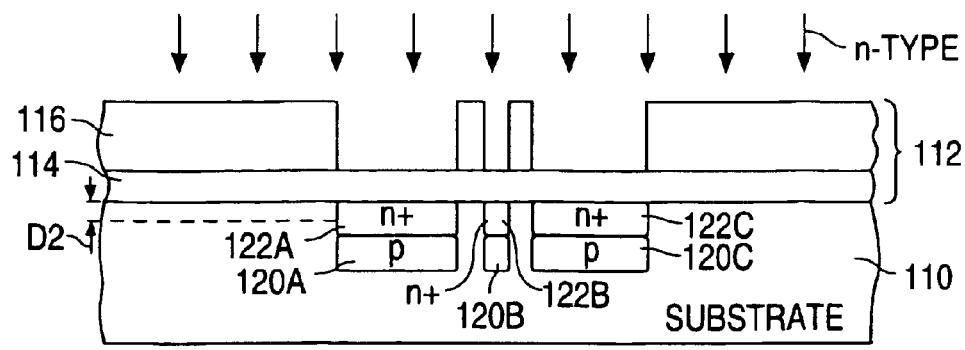

As shown in FIGS. 3A–3C, after regions 120A–120C have been formed, if formed, a n-type material is implanted into substrate 110 at an angle that is approximately 90° measured counterclockwise from the surface of substrate 110 to form three heavily-doped n-type regions 122A, 122B, and 122C in substrate 110. A lower implant energy is used, which is sufficient to place the centers of the implants a distance D2 below the surface of substrate 110. As shown, n+ regions 122A–122C extend from the surface of substrate 110 down to p-type isolation regions 120A–120C.

Figure 4A:
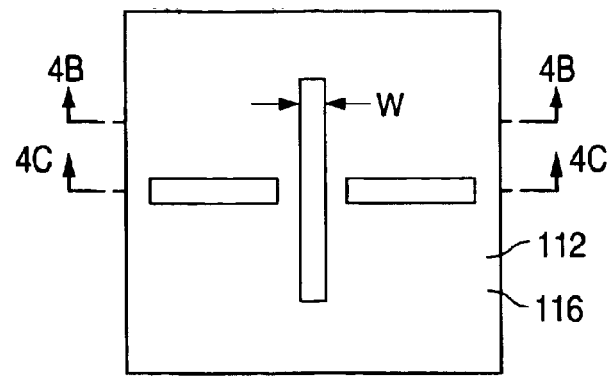
Figure 4B:
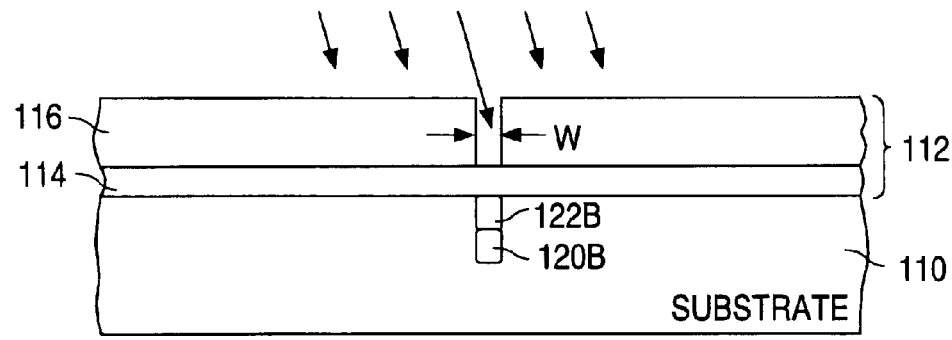
Figure 4C:
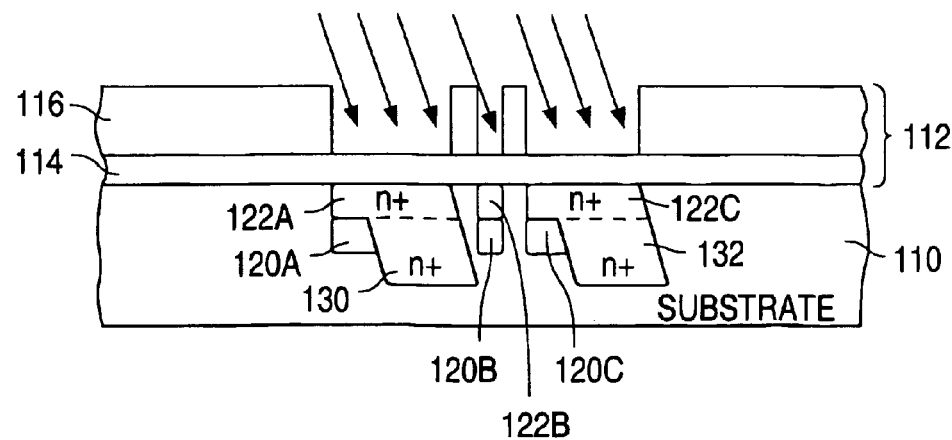

Following this, as shown in FIGS. 4A–4C, a n-type material is implanted into substrate 110 at an angle which forms a n+ region 130 that extends from n+ region 122A down under p-type isolation region 120B. The implant also forms a second n+ region 132 that extends from n+ region 122C down under the adjacent hard mask 112. In the present example, the width W of the opening over p-type isolation region 120B and n+ region 122B is narrow enough so that the angled implant does not introduce any significant dopant into substrate 110 in the regions adjacent to n+ region 122B.

Figure 5A:
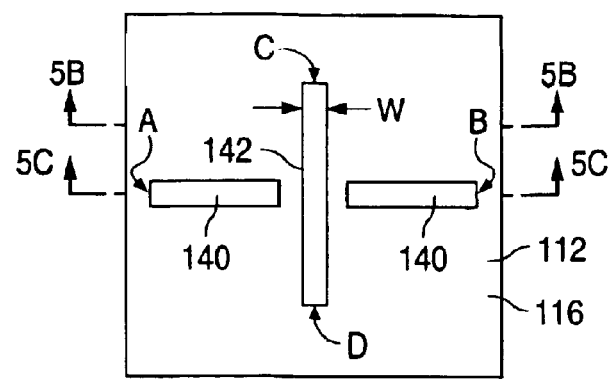
Figure 5B:
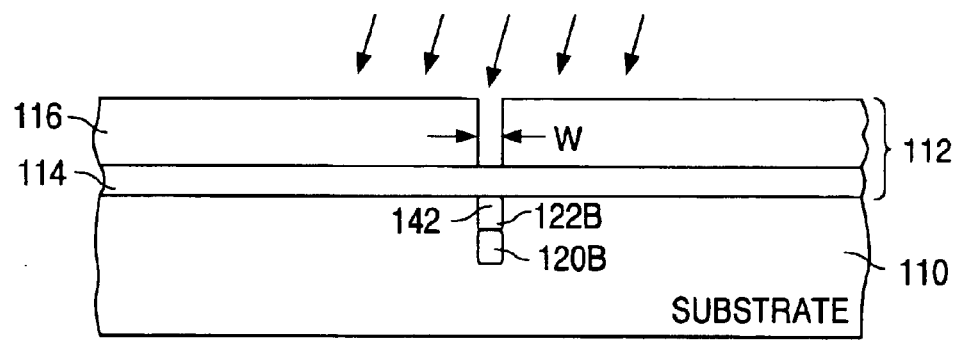
Figure 5C:
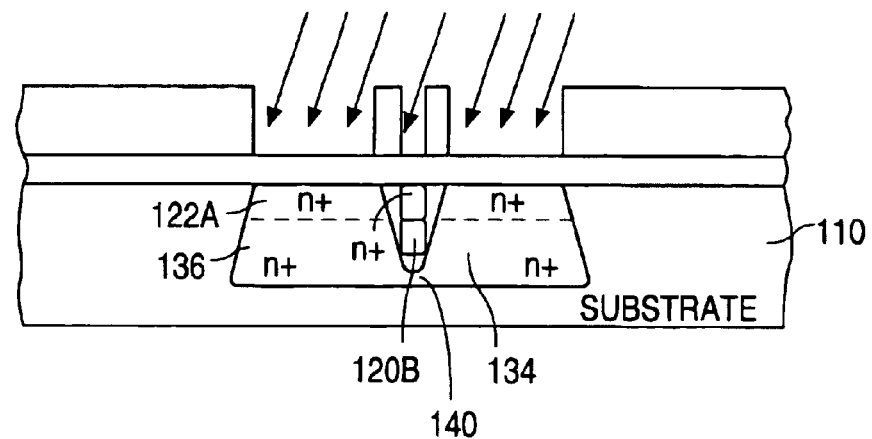

Next, as shown in FIGS. 5A–5C, a n-type material is implanted into substrate 110 at a reverse angle which, in combination with n+ region 132, forms a n+ region 134 that extends from n+ region 122C down under p-type isolation region 120B. The implant also forms, in combination with n+ region 130, a n+region 136 that extends from n+ region 122A down under the adjacent hard mask 112. As above, the width W of the opening over n+ region 122B is narrow enough so that the reverse angled implant does not introduce any significant dopant into substrate 110 in the regions adjacent to n+ region 122B.

In accordance with the present invention, n+ regions 130/136 and n+ regions 132/134 intersect each other to form a conductive channel 140 in substrate 110 that extends from point A to point B as shown in FIG. 5A. Conductive channel 140 dips under a conductive channel 142 that runs from point C to point D in substrate 110. Except for the dip, conductive channels 140 and 142 lie in the same plane.

Figure 6:
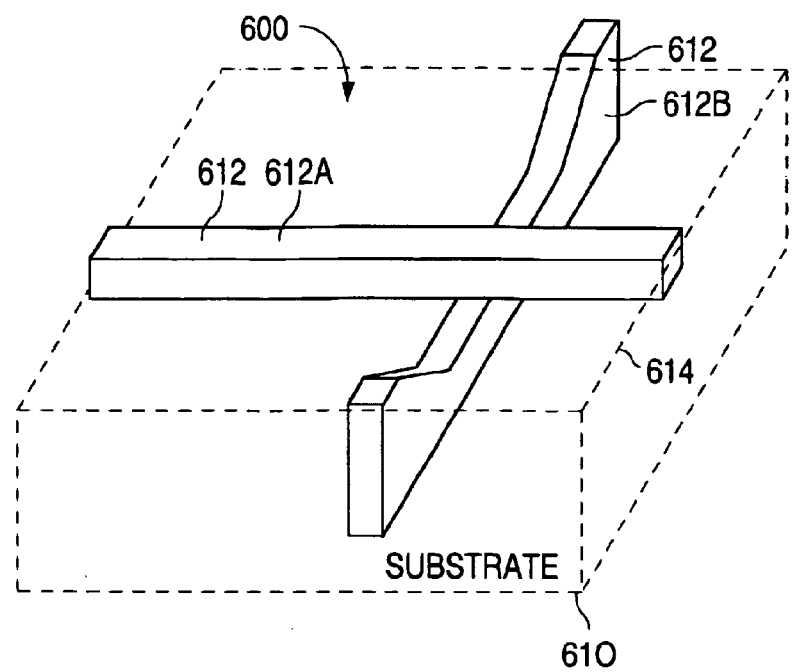
FIG. 6 is a perspective view illustrating a channel network 600 in accordance with the present invention.

FIG. 6 shows a perspective view that illustrates a channel network 600 in accordance with the present invention. As shown in FIG. 6, network 600, which is formed in a p-semiconductor substrate 610, includes a number of n+ conductive channels 612 that are formed in substrate 610.

The conductive channels 612 are formed in a channel plane 614 that lies substantially parallel with the top surface of substrate 610. In the present example, at least a first channel 612A intersects a second channel 610B. In the example shown in FIG. 6, second channel 612B has a U-shaped section that dips under first channel 612A to avoid contact with first channel 612A. Alternately, the U-shaped section can cross over, rather than under, the other channel.

In addition to forming conductive channels in semiconductor substrate, a circuit utilizing NMOS transistors can also be formed during the same process using a variation of hard mask 112. FIGS. 7A–7C through 14A–14C show a series of views that illustrate an example of a method of forming a subsurface connected circuit in accordance with the present invention.

Figure 7A:
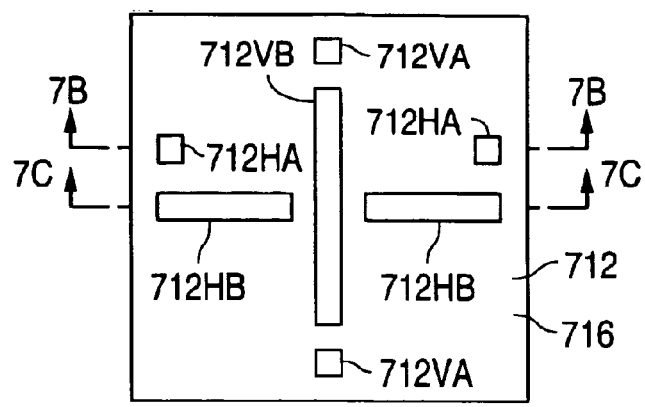
FIGS. 7A–7C through 14A–14C are a series of views illustrating an example of a method of forming a subsurface connected circuit in accordance with the present invention.
Figure 7B:
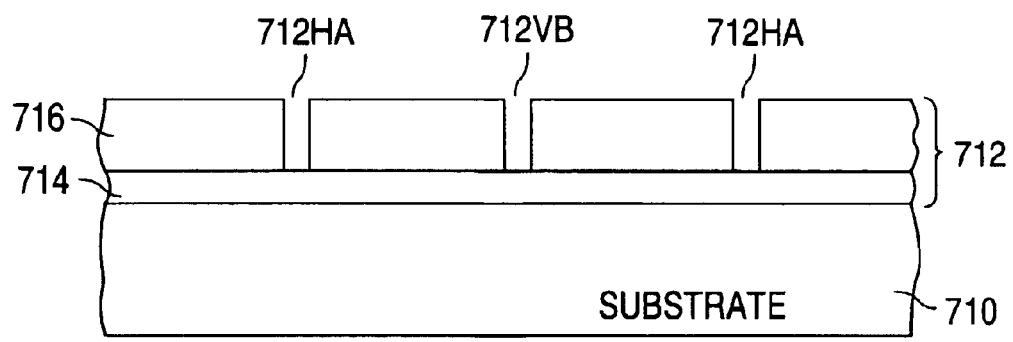
Figure 7C:
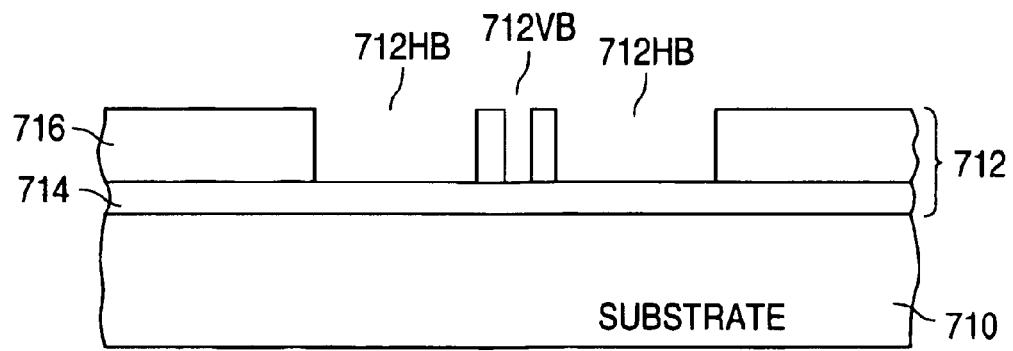

FIG. 7A shows a plan view that illustrates a portion of a wafer in accordance with the present invention. FIG. 7B shows a cross-sectional view taken along lines 7B—7B of FIG. 7A. FIG. 7C shows a cross-sectional view taken along lines 7C—7C of FIG. 7A.

As shown in FIGS. 7A–7C, the method of the present invention, which utilizes a p-semiconductor substrate 710, begins by performing a threshold voltage implant across the wafer to set the threshold voltages of the to-be-formed NMOS transistors. Following this, a hard mask 712 is formed and patterned on the top surface of substrate 710 to expose regions of substrate 710.

Hard mask 712 can be formed and patterned in the same manner as hard mask 112, e.g., using an oxide layer 714, an overlying nitride layer 716, and an patterning etch step that exposes regions of oxide layer 714 over substrate 710.

As shown in FIGS. 7A–7C, hard mask 712 differs from hard mask 112 in that hard mask 712 has a spaced-apart opening 712HA above both the left and right ends of a horizontal opening 712HB. In addition, hard mask 712 has a spaced-apart opening 712VA adjacent to both the top and bottom ends of a vertical opening 712VB.

Figure 8A:
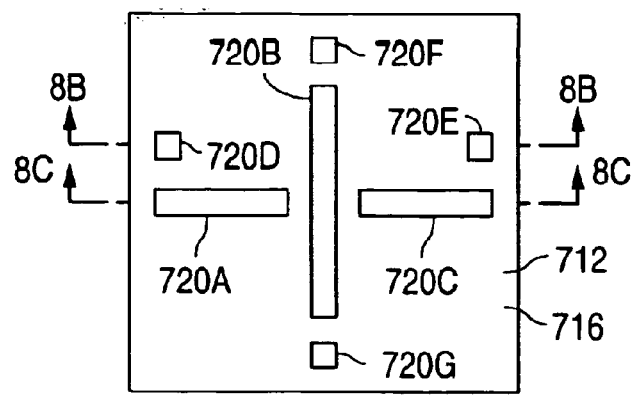
Figure 8B:
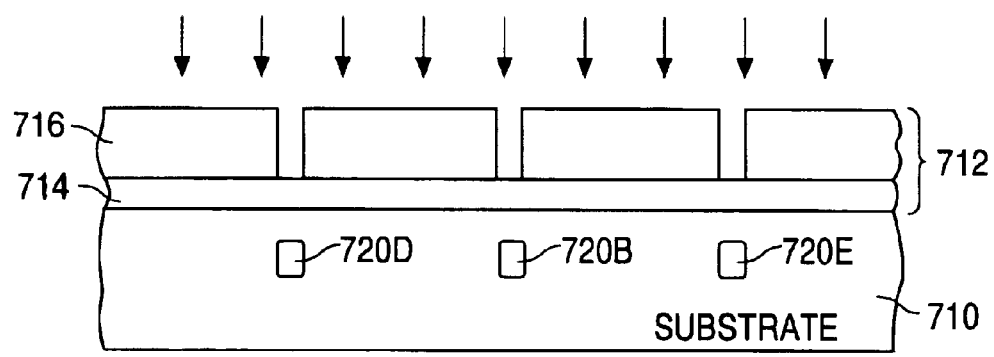
Figure 8C:
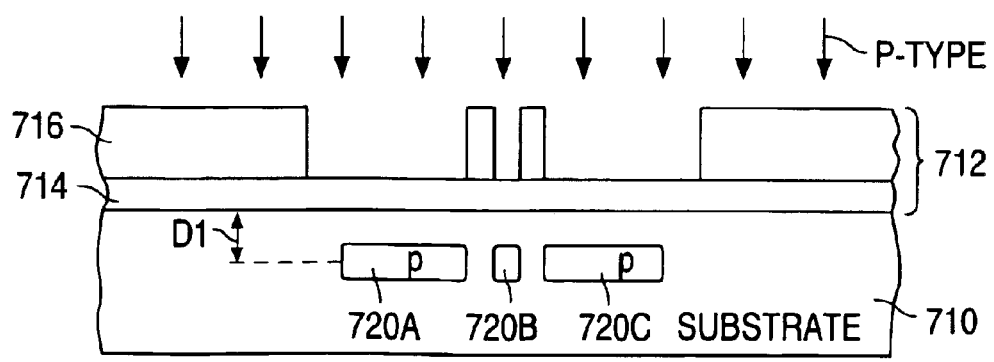

As shown in FIGS. 8A–8C, after patterned hard mask 712 has been formed, a p-type material is optionally implanted into substrate 710 at an angle of approximately 90° measured counterclockwise from the surface of substrate 710 to form seven p-type isolation regions 720A–720G in substrate 710. The implant energy used is sufficient to place the centers of regions 720A–720G a distance D1 below the surface of substrate 710.

Figure 9A:
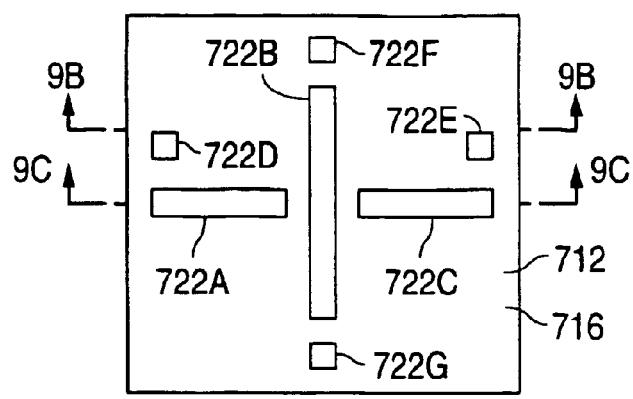
Figure 9B:
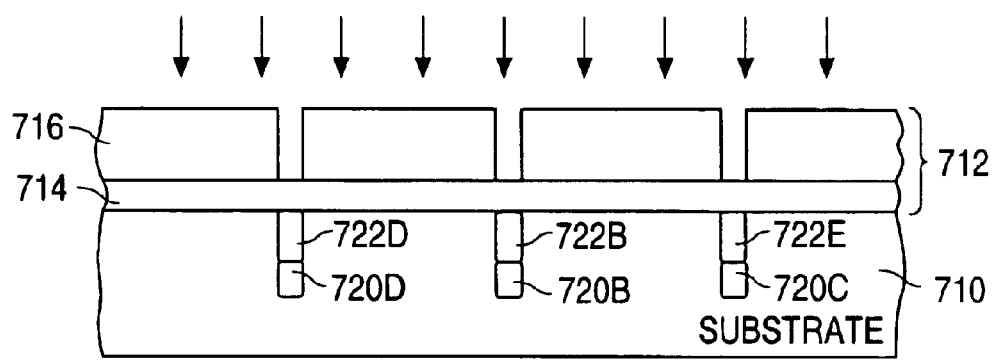
Figure 9C:
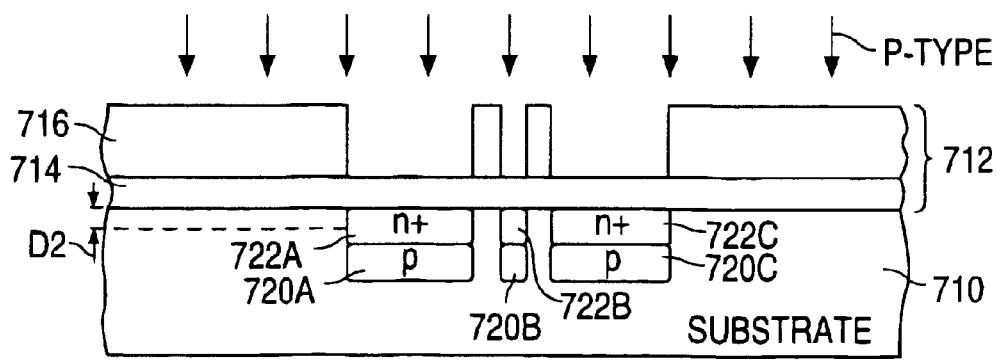

Next, as shown in FIGS. 9A–9C, a n-type material is implanted into substrate 710 at an angle of approximately 90° measured counterclockwise from the surface of substrate 710 to form seven heavily-doped n-type regions 722A–722G in substrate 710, (A lightly doped implant followed by the formation of side wall spacers can take place prior to the formation of n+ regions 722A–722G.) Regions 722A–722C function as conductive channels, while regions 722D–722G function as drain regions.

A lower implant energy is used when n+ regions 722A–722G are formed. The energy used is sufficient to place the centers of the implants a distance D2 below the surface of substrate 710. As shown, n+ regions 722A–722G extend from the surface of substrate 710 down to p-type isolation regions 720A–720G.

Figure 10A:
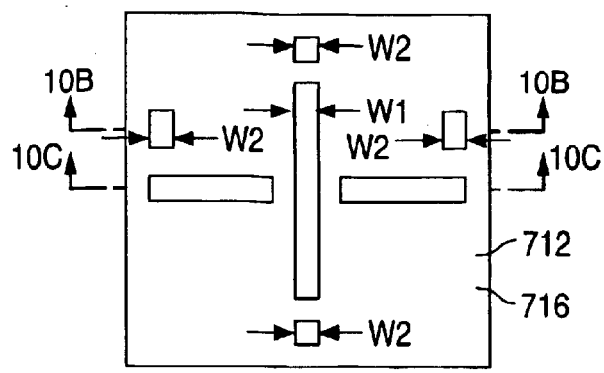
Figure 10B:
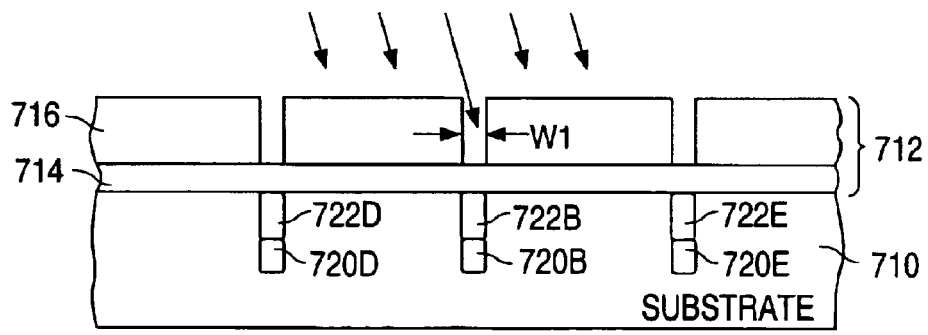
Figure 10C:
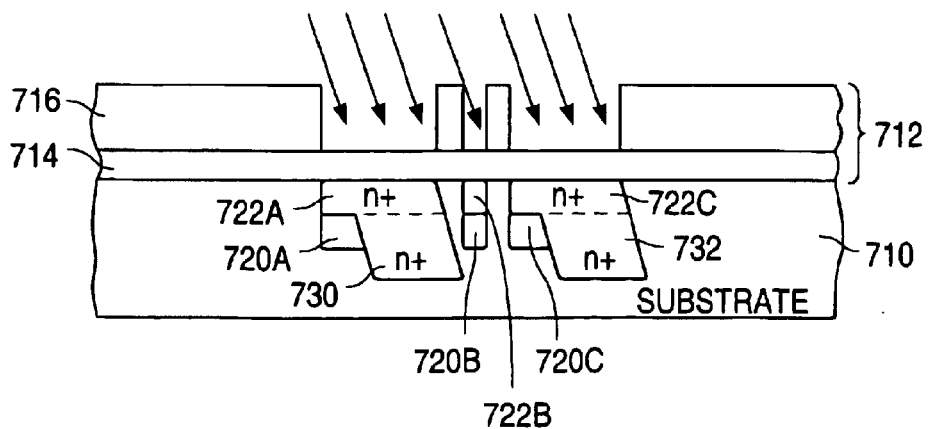

Following this, as shown in FIGS. 10A–10C, a n-type material is implanted into substrate 710 at an angle which forms a first n+ region 730 that extends from n+ region 722A down under p-type isolation region 720B. The angle is greater than zero and less than 90° measured counterclockwise from the surface of substrate 710. The implant also forms a second n+ region 732 that extends from n+ region 722C down under the adjacent hard mask 712.

In accordance with the present invention, the width W1 of the opening over p-type isolation region 720B and n+ region 722B is narrow enough (and the masking material is high enough) so that the angled implant does not introduce any significant dopant into substrate 710 in the regions adjacent to n+ region 722B. Further, the widths W2 of the openings over n+ regions 722D, 732E, 732F, and 732G are also narrow enough (and the masking material is high enough) so that the angled implant does not introduce any dopant into substrate 710 in the regions adjacent to n+ regions 722D, 732E, 732F, and 732G.

Figure 11A:
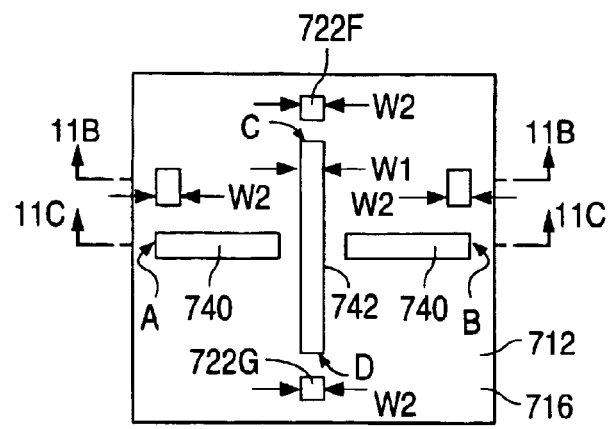
Figure 11B:
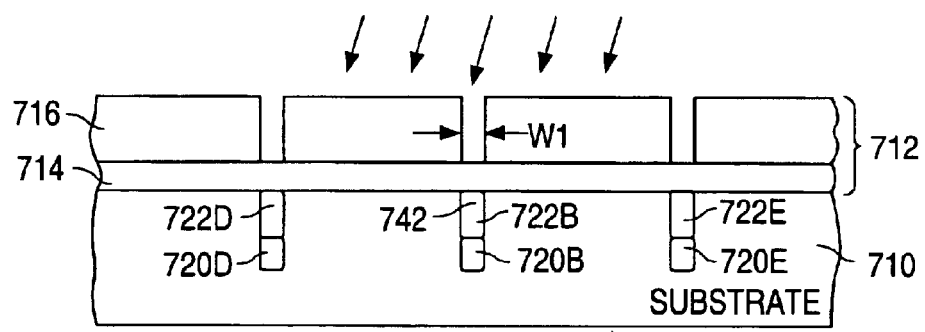
Figure 11C:
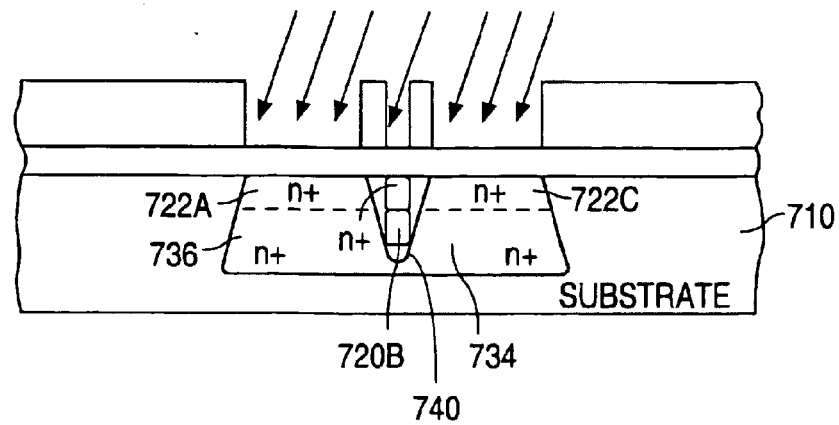

Next, as shown in FIGS. 11A–11C, a n-type material is implanted into substrate 710 at a reverse angle which, in combination with implant 732, forms a n+ region 734 that extends from n+ region 722C down under p-type isolation region 720B. The angle is greater than 90° and less than 180° measured counterclockwise from the surface of substrate 710. The implant also forms, in combination with implant 730, a n+ region 736 that extends from n+ region 722A down under the adjacent hard mask 712.

As above, the width W1 of the opening over p-type isolation region 720B and n+ region 722B is narrow enough (and the masking material is high enough) so that the reverse angled implant does not introduce any significant dopant into substrate 710 in the regions adjacent to n+ region 722B. Further, the widths W2 of the openings over n+ regions 722D, 722E, 722F, and 722G are also narrow enough (and the masking material is high enough) so that the angled implant does not introduce any significant dopant into substrate 710 in the regions adjacent to n+ drain regions 722D, 722E, 722F, and 722G.

In accordance with the present invention, n+ region 734 and n+ region 736 are connected to each other to form a conductive channel 740 in substrate 710 that extends from point A to point B as shown in FIG. 11A. Conductive channel 740 dips under a conductive channel 742 that extends from point C to point D in substrate 710. Except for the dip, conductive channels 740 and 742 lie in the same plane.

Figure 12A:
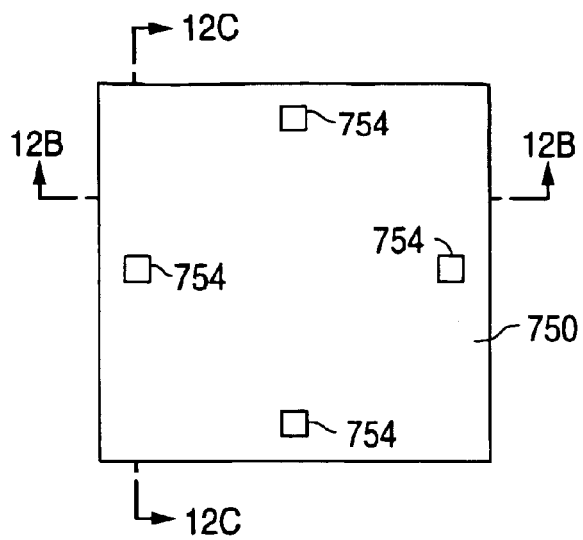
Figure 12B:
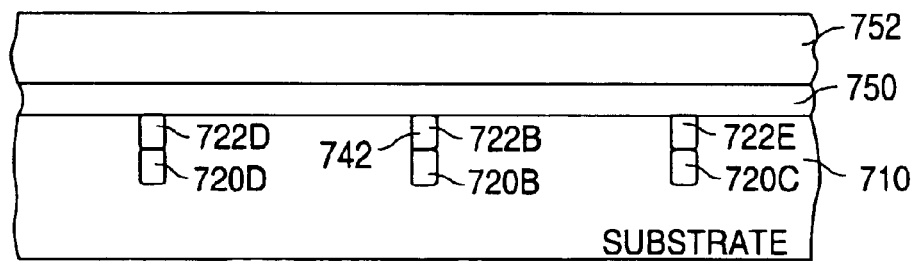
Figure 12C:
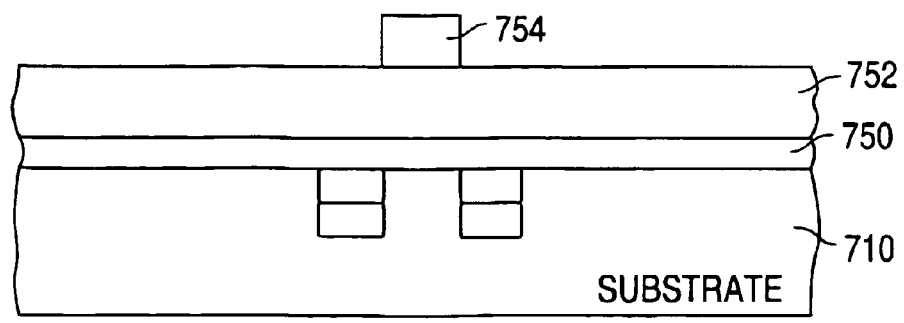

Following the implants, hard mask 712 (nitride layer 716 and oxide layer 714) are removed. Next, as shown in FIGS. 12A–12C, a layer of gate oxide 750 is formed on the top surface of substrate 710. Once oxide layer 750 has been formed, a layer of polysilion (poly) 752 is formed on gate oxide layer 750. After this, a layer of masking material 754 is formed and patterned on poly layer 752.

Figure 13A:
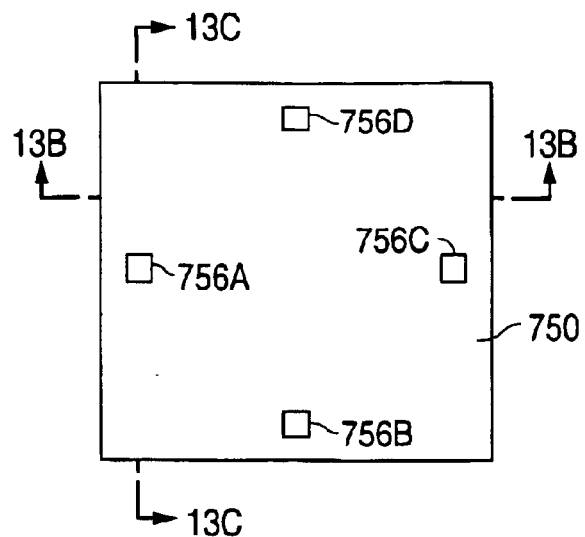
Figure 13B:
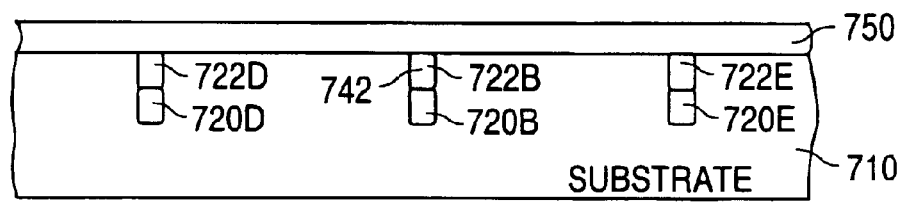
Figure 13C:
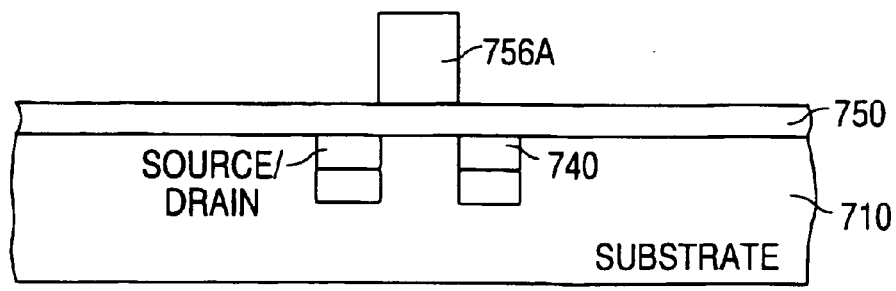

As shown in FIGS. 13A–13C, once masking layer 754 has been patterned, the exposed regions of poly layer 752 are removed to form gates 756A–756D. Following this, mask 754 is removed. Thus, drain regions 722D–722G, gates 756A–756D, and the ends of conductive channels 740 and 742 form four NMOS transistors.

As noted above, from FIGS. 9A–9C and 11A–11C, three consecutive dopant steps are performed. The doping steps can be performed in a step-wise or continuous manner. In the present invention, by controlling the dopant concentration, angle, tilt, and implant energy, a continuous rotating implant can be performed in a predetermined manner.

As a result, by forming a single hard mask and utilizing a single continuous, rotating, controlled implant, the active regions of a NMOS transistor and a number of conductive channels can be formed at the same time, thereby simplifying the number of process steps required to form the circuit. A simplified number of process steps, in turn, reduces the cost to fabricate the circuit.

Figure 14A:
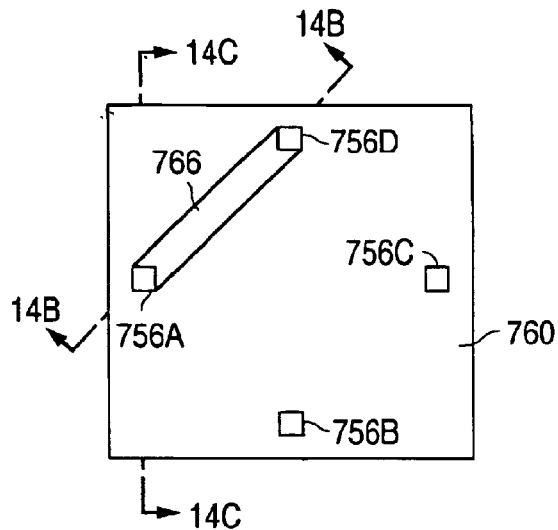
Figure 14B:
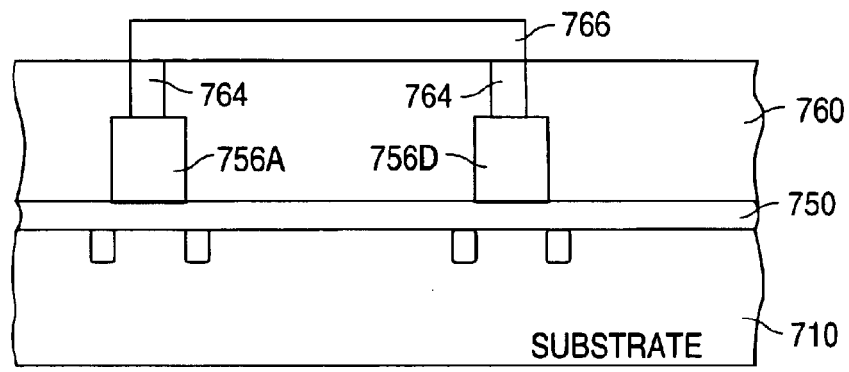
Figure 14C:
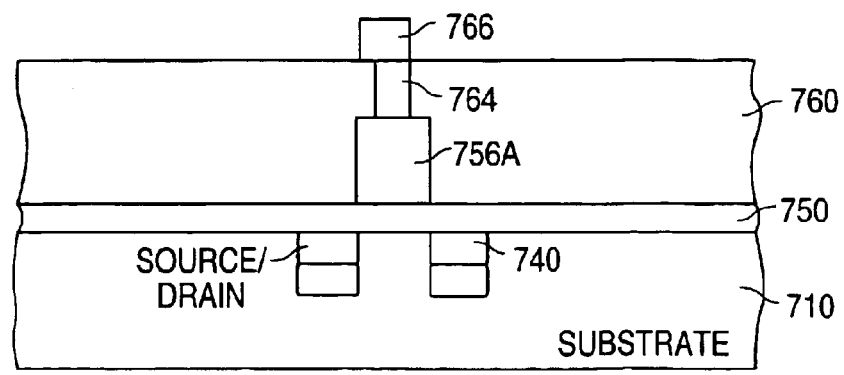

An NMOS transistor connected to channel 740 and an NMOS transistors connected to channel 742 can be connected together via a metal layer connected to the gates of the NMOS transistors. For example, as shown in FIGS. 14A–14C, a layer of insulation material 760 can be formed over semiconductor material 710 and gates 756. The insulation layer 760 is then patterned to form a plurality of openings that expose gates 756A–756D.

Following this, a number of contacts 764 are formed in the openings to contact gates 756A–756D. Next, a metal trace 766 is formed on the layer of insulation material to electrically connect one contact 764 with another contact 764 as required to implement the circuit.

In addition, PMOS transistors can be added to the process with the inclusion of only four additional masking steps. Two masking steps are required to set the threshold voltages of the NMOS and PMOS transistors. Hard mask 712 requires no additional steps, and can be patterned for both NMOS and PMOS circuits at the same time. Further, two masking steps are required during the formation of the transistors; one to protect the PMOS regions while the NMOS regions are formed, and one to protect the NMOS regions while the PMOS regions are formed.

Figure 15:
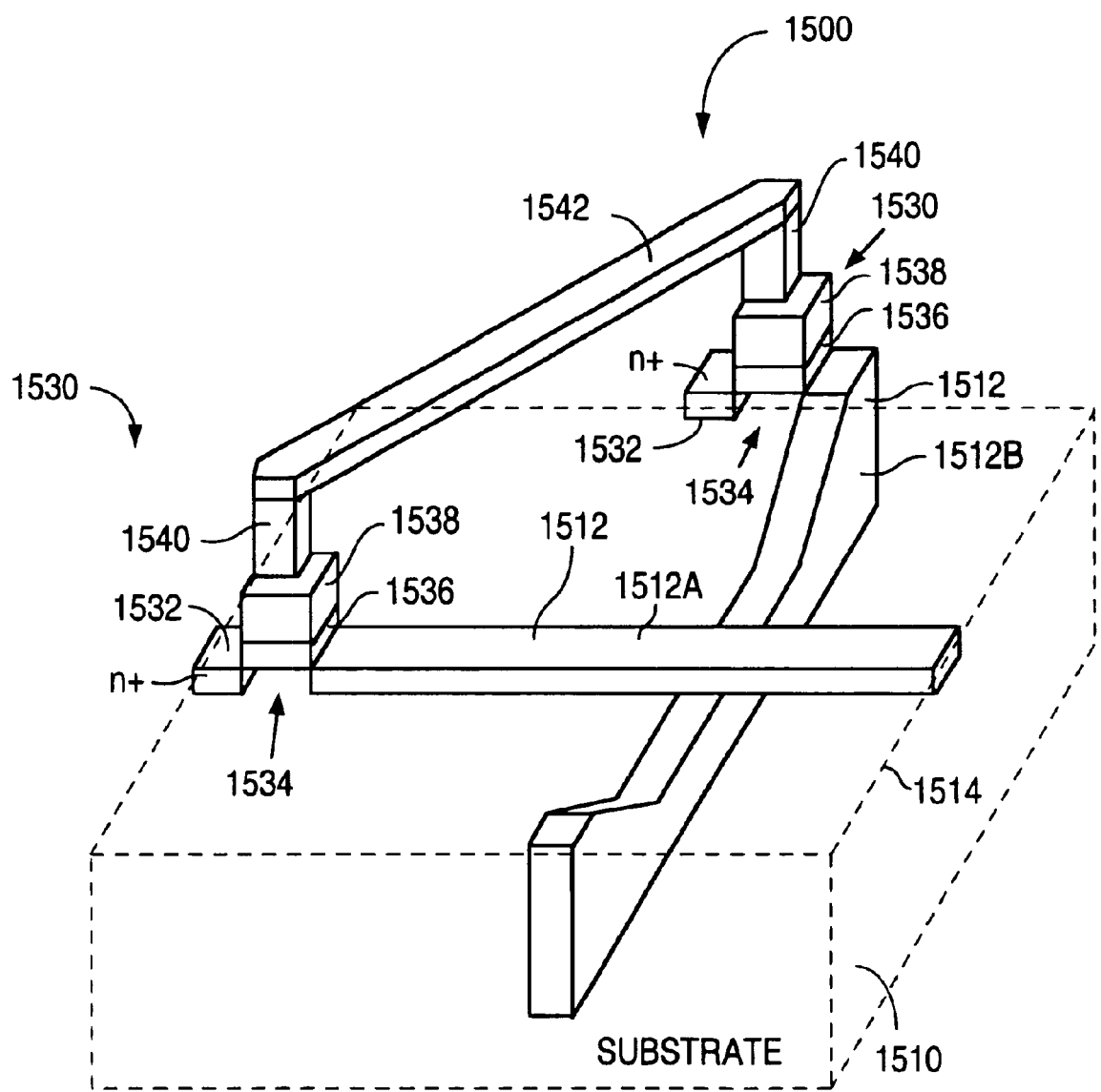
FIG. 15 is a perspective view illustrating an example of a subsurface connected circuit 1500 in accordance with the present invention.

FIG. 15 shows a perspective view that illustrates an example of a subsurface connected circuit 1500 in accordance with the present invention. As shown in FIG. 15, circuit 1500, which is formed in a semiconductor substrate 1510, includes a number of n+ conductive channels 1512 that are formed in substrate 1510.

The conductive channels 1512 are formed in a channel plane 1514 that lies substantially parallel with the top surface of substrate 1510. In the present invention, at least a first channel 1512A intersects a second channel 1512B. In the example shown in FIG. 15, second channel 1512B has a U-shaped section that dips under first channel 1512A to avoid contact with first channel 1512A. Alternately, the U-shaped section can cross over, rather than under, the other channel.

As further shown in FIG. 15, circuit 1500 additionally includes a number of NMOS transistors 1530 that are connected to channels 1512. Each transistor 1530 includes a n+ drain region 1532 that is formed in substrate 1510, and a channel region 1534 that lies between drain region 1532 and an end of a channel 1512.

Each transistor 1530 also includes a layer of gate oxide 1536 that is formed over channel region 1534, and a conductive gate 1538 that is formed on the layer of gate oxide 1536 over channel region 1534. Further, contacts 1540 are formed on each gate 1538 (not directly over the channel region), and a metal trace 1542 connects two of the contacts 1540 together.

As a result, by forming a single hard mask, utilizing a single controlled implant, and patterning a layer of polysilicon, NMOS transistors and a first level of interconnect can be formed at the same time, thereby simplifying or reducing the number of process steps required to form the circuit. A simplified or reduced number of process steps, in turn, reduces the cost to fabricate the circuit.

Thus, in accordance with the present invention, by using a hard mask and precisely varying the implant angle, rotation, dose, and energy, a particular atomic species may be placed volumetrically in a required location under the hard mask. Further, the dopant may be implanted to form sub-silicon volumes of rather arbitrary topographies. Examples include pipes, volumes, hemispheres, and interconnects.

Figure 16:
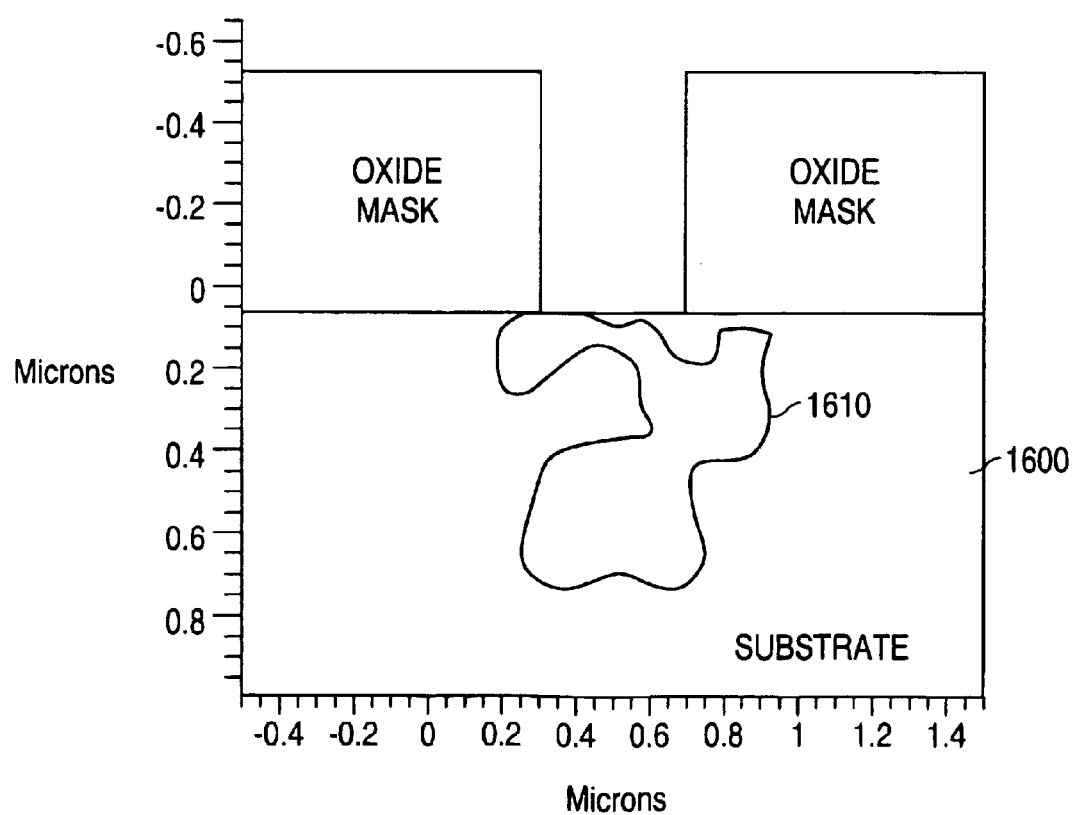
FIG. 16 is a cross-sectional diagram illustrating an example of a semiconductor substrate 1600 with a random dopant profile in accordance with the present invention.

FIG. 16 shows a cross-sectional diagram that illustrates an example of a semiconductor substrate 1600 with a random dopant profile in accordance with the present invention. As shown in FIG. 16, by varying the dopant concentration, angle, tilt, and implant energy in a precalculated manner, an arbitaray 3D n-type dopant profile 1610 can be obtained. In the present invention, these factors (dopant concentration, angle, tilt, and implant energy) can be varied step-wise or continously.

Profile 1610 is a random profile that serves no particular purpose, but illustrates as an example the variety of profiles that can be obtained in accordance with the present invention. (Profile 1610 is an example of the degree of non-linear dopant profiling that may be introduced into the silicon volume.)

It should be understood that the above description is of an example of the present invention, and that various alternatives to the embodiment of the invention described herein may be employed in practicing the invention. For example, although hard masks 112 and 712 have been shown as lines and spaced-apart regions, hard masks 112 and 712 can have a variety of shapes, such as polygons and triangles, as needed to create the required sub-surface dopant profile. Thus, it is intended that the following claims define the scope of the invention and that methods and structures within the scope of these claims and their equivalents be covered thereby.

What is claimed is:

1. A semiconductor circuit formed in a semiconductor material of a first conductivity type, the circuit comprising a network of subsurface conductive channels of a second conductivity type opposite the first conductivity type, the network including a first subsurface channel and a second subsurface channel, both the first and second subsurface channels having a length and lying in a same plane, the first subsurface channel having a U-shaped section that vertically passes around without contacting the second subsurface channel.

2. The semiconductor circuit of claim 1 and further comprising a plurality of MOS transistors, the plurality of MOS transistors including a first MOS transistor that has:
   a first drain region of the second conductivity type formed in the semiconductor material a distance away from an end of the first subsurface channel;
   a first channel region lying between the first drain region and the end of the first subsurface channel;
   a layer of gate oxide formed over the channel region; and
   a first gate formed on the layer of gate oxide over the channel region.

3. The semiconductor circuit of claim 2 wherein the plurality of MOS transistors further includes a second MOS transistor that has:
   a second drain region of the second conductivity type formed in the semiconductor material a distance away from an end of the second subsurface channel;
   a second channel region lying between the second drain region and the end of the second subsurface channel;
   the layer of gate oxide formed over the second channel region; and
   a second gate formed on the layer of gate oxide over the second channel region.

4. A semiconductor circuit formed in a semiconductor material of a first conductivity type, the circuit comprising:
   a network of subsurface conductive channels of a second conductivity type opposite the first conductivity type, the network including a first subsurface channel and a second subsurface channel, both the first and second subsurface channels having a length and lying in a same plane, the first subsurface channel having a U-shaped section that passes around without contacting the second subsurface channel;
   a plurality of MOS transistors, the plurality of MOS transistors including:
      a first MOS transistor that has:
         a first drain region of the second conductivity type formed, in the semiconductor material a distance away from an end of the first subsurface channel;
         a first channel region lying between the first drain region and the end of the first subsurface channel;
         a layer of gate oxide formed over the channel region; and
         a first gate formed on the layer of gate oxide over the channel region,
      a second MOS transistor that has:
         a second drain region of the second conductivity type formed in the semiconductor material a distance away from an end of the second subsurface channel;
         a second channel region lying between the second drain region and the end of the second subsurface channel;
         the layer of gate oxide formed over the second channel region; and
         a second gate formed on the layer of gate oxide over the second channel region;
   a layer of insulation material formed on the semiconductor material, the first gate, and the second gate, the layer of insulation material having a plurality of openings, the openings including a first opening that exposes a portion of the first gate and a second opening that exposes a portion of the second gate;
   a plurality of contacts including a first contact formed in the first opening to make an electrical connection with the first gate, and a second contact formed in the second opening to make an electrical connection with the second gate; and
   a metal trace formed on the layer of insulation material that makes an electrical connection with the first contact and the second contact.

5. A semiconductor circuit formed in a semiconductor material of a first conductivity type, the semiconductor material having a top surface, the circuit comprising:

a first conductive strip of a second conductivity type opposite the first conductivity type formed in the semiconductor material, the first conductive strip having:
a width,
a length that is substantially greater than the width,
a first lateral side, and
a second lateral side opposite to the first lateral side; and a second conductive strip of the end conductivity type formed in the semiconductor material spaced apart from the first conductive strip, the second conductive strip having:
a width,
a length that is substantially greater than the width of the second conductive strip,
a first section that lies adjacent to the first side of the first conductive strip and extends away from the first side by more than the width of the second conductive strip,
a second section that lies adjacent to the second side of the first conductive strip, and
a connecting section that contacts the first and second sections.

6. The semiconductor circuit of claim 5 wherein a region of the first conductivity type with a dopant concentration greater than the semiconductor material lies below and contacts the first conductive strip.

7. The semiconductor circuit of claim 5 wherein the first and second conductive strips lie entirely within the semiconductor material.

8. The semiconductor circuit of claim 5 wherein:
the first conductive strip has a first depth from the top surface of the semiconductor material; and
the second conductive strip has a second depth from the top surface of the semiconductor material, the second depth being greater than the first depth.

9. The semiconductor circuit of claim 5 and further comprising a plurality of MOS transistors, the plurality of MOS transistors including a first MOS transistor that has:
a first drain region of the second conductivity type formed in the semiconductor material a distance away from an end of the first conductive strip;
a first channel region lying between the first drain region and the end of the first conductive strip;
a layer of gate oxide formed over the channel region; and
a first gate formed on the layer of gate oxide over the channel region.

10. The semiconductor circuit of claim 5 wherein:
the first conductive strip contacts the top surface of the semiconductor material; and
the second conductive strip contacts the top surface of the semiconductor material.

11. The semiconductor circuit of claim 5 wherein the first and second conductive strips are non-parallel.

12. The semiconductor circuit of claim 5 wherein the first and second conductive strips lie entirely within the semiconductor material.

13. The semiconductor circuit of claim 6 wherein the connecting section lies below the region of the first conductivity type.

14. The semiconductor circuit of claim 9 wherein the plurality of MOS transistors further includes a second MOS transistor that has:
a second drain region of the second conductivity type formed in the semiconductor material a distance away from an end of the second conductive strip;
a second channel region lying between the second drain region and the end of the second conductive strip;
the layer of gate oxide formed over the second channel region; and
a second gate formed on the layer of gate oxide over the second channel region.

15. The semiconductor circuit of claim 14 and further comprising:
a layer of insulation material formed on the semiconductor material, the first gate, and the second gate, the layer of insulation material having a plurality of openings, the openings including a first opening that exposes a portion of the first gate and a second opening that exposes a portion of the second gate;
a plurality of contacts including a first contact formed in the first opening to make an electrical connection with the first gate, and a second contact formed in the second opening to make an electrical connection with the second gate; and
a metal trace formed on the layer of insulation material that makes an electrical connection with the first contact and the second contact.

16. The semiconductor circuit of claim 12 wherein:
the first conductive strip has a first depth from the top surface of the semiconductor material; and
the second conductive strip has a second depth from the top surface of the semiconductor material, the second depth being greater than the first depth.

17. The semiconductor circuit of claim 12, wherein:
the first conductive strip contacts the top surface of the semiconductor material; and
the second conductive strip contacts the top surface of the semiconductor material.

18. The semiconductor circuit of claim 12 wherein a region of the first conductivity type with a dopant concentration greater than the semiconductor material lies below and contacts the first conductive strip.

19. The semiconductor circuit of claim 12 wherein the first and second conductive strips are non-parallel.

20. The semiconductor circuit of claim 18 wherein the connecting section lies below the region of the first conductivity type.

* * * * *

UNITED STATES PATENT AND TRADEMARK OFFICE
CERTIFICATE OF CORRECTION

PATENT NO. : 6,844,585 B1  Page 1 of 1
DATED : January 18, 2005
INVENTOR(S) : Hopper et al.

It is certified that error appears in the above-identified patent and that said Letters Patent is hereby corrected as shown below:

Column 2,
Line 54, delete "1800" and replace with -- 180° --.
Line 64, delete through" and replace with -- and --.

Column 6,
Line 52, delete "semiconductor" and replace with -- p-semiconductor --.

Column 7,
Line 28, delete "precalculated" and replace with -- pre-calculated --.

Column 9,
Line 12, delete "end" and replace with -- second --.

Signed and Sealed this

Twenty-second Day of March, 2005

JON W. DUDAS
*Director of the United States Patent and Trademark Office*